(12) United States Patent
Singh

(10) Patent No.: US 7,148,189 B2
(45) Date of Patent: *Dec. 12, 2006

(54) CHEMICAL-MECHANICAL POLISHING SLURRY FOR POLISHING METAL FILMS

(75) Inventor: Rajiv Singh, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 217 days.

This patent is subject to a terminal disclaimer.

(21) Appl. No.: 10/646,157

(22) Filed: Aug. 22, 2003

(65) Prior Publication Data

US 2004/0043702 A1    Mar. 4, 2004

Related U.S. Application Data

(63) Continuation-in-part of application No. 10/081,979, filed on Feb. 22, 2002, now Pat. No. 6,821,309.

(51) Int. Cl.
*C11D 7/60* (2006.01)

(52) U.S. Cl. ...................................... 510/268; 438/687

(58) Field of Classification Search ............... 252/79.1; 438/692; 510/175, 176; 51/307; 106/3; *C69D 1/04*
See application file for complete search history.

(56) References Cited

U.S. PATENT DOCUMENTS 5,676,760 A * 10/1997 Aoki et al. ................. 134/1.3
6,436,811 B1 * 8/2002 Wake et al. ................. 438/633
6,530,968 B1 * 3/2003 Tsuchiya et al. .............. 51/307
6,593,236 B1 * 7/2003 Pyo ............................ 438/687
6,821,309 B1 * 11/2004 Singh et al. ................... 51/307
6,830,503 B1 * 12/2004 Grumbine .................... 451/41
2002/0006727 A1 * 1/2002 Pyo ............................ 438/689
2003/0159362 A1 * 8/2003 Singh et al. .................. 51/293

OTHER PUBLICATIONS

Rosen, M., "Surfactants and Interfacial Phenomena," Second Edition, John Wiley & Sons, 1989, p. 3-32, 52-54, 70-80, 122-132, and 398-401.
Mukerjee, P. and Mysels, K., "Critical Mircelle Concentrations of Aqueous Surfactant Systems," Nat. Stand. Ref. Data Ser., Nat. Bur. Stand. (U.S.), 36: 23-50, 1971.

* cited by examiner

*Primary Examiner*—Gregory Webb
(74) *Attorney, Agent, or Firm*—Akerman Senterfitt; Neil R. Jetter

(57) ABSTRACT

A slurry and related method for chemical mechanical polishing (CMP) of a metal film includes a solution containing at one halide ion and at least one halogen species which react with the metal film to form a surface layer on the film. The surface layer formed can be a metal halide layer. The surface layer can be removed by abrasive particles embedded in the polishing pad, or a thin inorganic layer coated on the polishing pad.

9 Claims, No Drawings

CHEMICAL-MECHANICAL POLISHING SLURRY FOR POLISHING METAL FILMS

CROSS-REFERENCE TO RELATED APPLICATIONS

This application is a Continuation-In-Part of application Ser. No. 10/081,979 filed Feb. 22, 2002 now U.S. Pat. No. 6,821,309 entitled "CHEMICAL-MECHANICAL POLISHING SLURRY FOR POLISHING OF METAL COMPRISING FILMS".

STATEMENT REGARDING FEDERALLY SPONSORED RESEARCH OR DEVELOPMENT

Not applicable

1. Field of the Invention

This invention relates to a slurry and method for chemical-mechanical polishing of metal comprising films.

2. Background

Reductions in semiconductor device dimensions provide higher densities and improved performance for integrated circuits. In many integrated electronic devices, millions of discrete elements, such as transistors, resistors and capacitors, are interconnected. Due to an increase in device density provided by scaling of semiconductor processes to improve circuit performance, it is no longer generally possible to utilize a single metal interconnect level. Single level interconnects result in significant parasitic resistance which can adversely affect device performance, particularly the dynamic performance of the integrated circuit.

Copper has become an increasingly popular choice for interconnect metal and has begun replacing aluminum in certain applications. Copper is substantially much more electrically conductive than aluminum, allowing finer wires having lower resistive losses. Copper is also significantly less vulnerable to electromigration than aluminum and less likely to fracture under stress. Electromigration is the drift of metal atoms when a conductor carries high current densities, and can create reliability problems through generation of voids and other defects.

Although, copper provides advantages over aluminum, it has at least one major disadvantage. Copper is poisonous to silicon since it readily diffuses into silicon and causes deep-level defects. Therefore, copper must be isolated from silicon, usually through use of a suitable barrier layer.

Multilevel metallization structures have been developed which include an interconnection structure having several levels of metallization separated by thin insulating layers. Metal plugs are used to connect the different metal levels to one another. Presently, aluminum alloys (e.g. Al/Si/Cu) are still commonly used for the metal interconnect, while tungsten is generally used for plug structures as the material of choice for interconnecting two levels of metals. Aluminum and its alloys are generally dry etched, such as reactive ion etching and plasma etching. However, dry etching of copper is not currently feasible. Accordingly, when copper and its alloys are used instead of conventional aluminum or aluminum alloys as an interconnection material, alternative techniques are employed to define the copper lines.

For example, a damascene process together with chemical-mechanical polishing (CPM) can be used to define copper lines. In a damascene process, trenches are etched in a dielectric material, such as silicon dioxide ($SiO_2$). A barrier material is then deposited, generally by sputtering. Copper is then deposited typically using electrodeposition techniques (e.g. electroplating) to fill the barrier lined trenches. In the case of electrodeposition of copper onto a silicon wafer, the wafer is typically coated with a thin conductive layer of copper (seed layer) to produce electrically conductive surfaces before being immersed in a solution containing cupric ions. The copper seed layer is preferably extremely thin, but must still be continuous across all features on the wafer surface to maximize deposition of copper on via sidewalls while minimizing the layer thickness on the bottom of the features and on the field of the wafer. The copper film is then removed by CMP to define the copper lines.

CMP combines both chemical action and mechanical forces and is commonly used to remove metal deposits in damascene processes, remove excess oxide in shallow trench isolation steps, and to reduce topography across a dielectric region. Components required for CMP include a chemically reactive liquid medium and a polishing surface to provide the mechanical control required to achieve planarity. Either the liquid or the polishing surface may contain nano-size inorganic particles to enhance the reactive and mechanical activity of the process. CMP is the only technique currently known for producing die level flatness required for sub 0.5 μm devices and is considered a requirement for the production of sub 0.2 μm device structures and state-of-the-art metal interconnect schemes.

Conventional CMP processes for polishing metal comprising layers generally oxidize the top layer of the metal to form an oxide which is then polished off using abrasive particles. However, because the oxide layer is generally quite hard, generally being higher than the metal film to be polished, CMP results in problems including high levels of dishing, erosion, surface scratching, peeling, and significant polishing of underlying layers.

SUMMARY OF THE INVENTION

A slurry and related method for chemical mechanical polishing (CMP) of a metal film includes a solution containing at one halide ion and at least one halogen species which react with the metal film to form a thin surface layer on the metal. A slurry for chemical mechanical polishing (CMP) of a metal comprising film comprises a solution including at one halide ion and at least one halogen species for reacting with said metal film to form a surface layer on the film. The halogen can comprises $I_2$ while the halide ion can comprise $I^-$. The halogen can be formed from at least one chemical which forms the halogen in-situ in the slurry. In this embodiment, the halogen can be $I_2$.

The halogen can comprise $Br_2$ or $Cl_2$. The slurry can include particles comprising silica, alumina, titania, yttria, zirconia, zinc oxide, or porous silica. Coated particles can comprise alumina or silica cores coated with alumina, yttria, titania, or a polymer.

The slurry can include at least one surfactant, polymer additive or salt. The slurry can include at least one interhalogen compound.

A method for chemical mechanical polishing (CMP) a metal comprising containing film includes the steps of providing a slurry including at one halide ion and at least one halogen species, the slurry reacting with the metal film to form a surface layer on the film. The surface layer is then removed. The surface layer can be removed by (i) mechanical action of the pad, (ii) abrasive particles which are a part of the slurry or (iii) particles which may be embedded or disposed on the surface of the pad. The metal film can include copper.

DETAILED DESCRIPTION OF THE PREFERRED EMBODIMENTS

The invention relates to a slurry and method for chemical-mechanical polishing (CMP) of a metal comprising film. Metal films include Cu, Ag, Au, Ta, TaN, TaSiN, W, metallic alloys thereof, as well as conducting metal nitrides and oxides. The slurry solution includes at one halide ion and at least one halogen species for reacting with the metal comprising film to form a surface layer on a surface of the film.

As defined herein and generally recognized in solution chemistry and used in the application, the term "halogen" refers to a diatomic molecule, such as $I_2$, $Br_2$, $Cl_2$, and $F_2$. Halogens can be directly added to the slurry, or formed in-situ in the slurry. For examples, the addition of an oxidizer, such as hydrogen peroxide ($H_2O_2$) or potassium iodate ($KIO_3$), and iodide ions ($I^-$), can lead to the partial conversion of iodide ions into halogen iodine ($I_2$). The halogens in the slurry may combine with halide ions to form polyhalide ions. Interhalogen compounds which combined different halogen, such as ICl, IBr, and others can also be used.

Halogens in solution produce characteristic colors to the solution, such as a purple color when $Br_2$ is present or varying from light yellow to deep yellow to black if iodine in different concentrations is present. The phrase "polyhalide ion" is also well defined in solution chemistry and as used herein refers to a molecular ion including at least two bound Group VIIA species, the species not necessarily being different, such as $I_3^-$. Polyhalide ions are generally formed by mixing a halogen with a halide ion, such as:

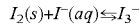
$$I_2(s) + I^-(aq) \leftrightarrows I_3^-$$

Polyhalide ions can be contrasted with halide ions, which are also well defined and refer to monoatomic ions, such as F—, Cl— and Br—. Halide ions, by themselves, are not known to impart color to a solution. Halide ions have reactivities quite distinct from polyhalide ions.

The invention can be used to polish a metal comprising film for a variety of semiconductor production processes, such as a CMOS or BiMOS process, or in other applications such as magnetic storage heads and other devices. The metal comprising film can be used for device interconnection or as a part of the gate electrode structure for transistor-based semiconductor devices. The metal film can either be a single layer or one of multiple metal layers between insulating materials, or in a multiple metal layer stacked structure.

The invention substantially overcomes problems associated with CMP of most metal comprising layers commonly used in semiconductor fabrication. Specifically, the formation of a surface layer having a controlled hardness permits a reduction in dishing, erosion, surface scratching, peeling, and also a reduction in the polishing of underlying layers.

In a preferred embodiment of the invention, the surface layer formed is a metal halide layer, such as copper iodide (CuI) or silver iodide (AgI). Halides and halogens may be added directly to the slurry or formed from an in-situ reaction process in the slurry solution. In a ex situ process, the halogen and halide ions are added together, while in an in situ process, the halide ions can be partially oxidized by another oxidizer to form halogen ions. For example

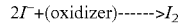
$$2I^- + (\text{oxidizer}) \longrightarrow I_2$$

The oxidizer can be hydrogen peroxide, potassium iodate or another species which removes electrons from the iodide ion forming the halogen iodine. The halogen can then combine with excess halide ions to form polyhalide ions.

The reaction with the polyhalide ions and the metal surface forms a thin metal halide layer. The metal halide layers can be removed in a variety of manners. The mechanical action of the pad can removed the metal halide layer. In this mode, no particle are required in the slurry. In another embodiment abrasive particles may be used. The abrasive particles may be embedded in the polishing pad itself or supplied as abrasives in the slurry.

The reactive chemicals in the slurry forms a passive and easily removable layer on the surface of the metal comprising film when the slurry contacts the metal film. Whether the layer will form on the metal surface can be predicted by determining the Gibb's free energy for the reaction in question. If the Gibb's free energy ($\Delta G$) of the particular reaction is negative, the reaction will generally occur spontaneously. The concentration of halogen and halide ion is generally in the concentration range of from about 0.1 mM to 1 M. The pH of the slurry can be from 1 to 12. Preferably, the pH of the slurry is from 2 to 9. The surface layer formed is also preferably substantially insoluble in the slurry solution to limit the static etch rate by passivating the surface. The degree of insolubility of the soft layer can be quantified by the rate of dissolution of the film. The rate of dissolution should not generally exceed 50 nm/minute.

If the surface layer formed exhibits any significant solubility in the slurry, the planarity of the surface can be compromised. It is known that chlorides, iodides, carbonates, bromides of metal comprising layers are insoluble in most solutions, and thus have the capability to passivate the surface.

If a passivation layer is not formed on the surface of the metal comprising film, the static etching rate of metal comprising will generally be very high, which can degrade the planarity of the wafer during polishing. Since the easily removable layer formed on the metal comprising surface from reaction with the slurry solution, it is generally easily removable from the surface when mechanical abrasion is applied during the polishing process. Mechanical abrasion can be provided either with or without particles in the slurry.

When the slurry is particle-free, the polymeric polishing pad provides the necessary mechanical abrasion when it rubs against the rotating wafer surface. Particles which can be used include silica, alumina, titania, yttria, zirconia, ceria, zinc oxide, or any oxide of a transition metal, silicon nitride polymeric particle such as polystyrene, polytetafluoroethylene, polyamide, nanoporous particles such as porous silica. These particles can have a size range varying from 5 nm to 50 microns, the preferable range being from 10 nm to 500 nm. The particles can be coated with thin (0.11 nm to 1 micron thick) layers of another material. The particles can also be mixtures of each other. The nanoporous particle are typically nanoporous silica, titania, and other metallic oxides and have a porosity varying from 0.1% to 60% by volume. The pore size can vary from 1 Angstrom to 100 Angstroms. The concentration of the particles can vary from 0.001% to 50 weight %.

A variety of surfactants can be used with the invention. Surfactants can either be cationic, anionic, zwitterionic or non-ionic. The surfactants can be used individually or in a mixed state. Details on the type of surfactants that can be used with the invention can be found in a book by M. J. Rosen, Surfactants and Interfacial Phenomena, John Wiley & Sons, 1989 pg. 3–32, 52–54, 70–80, 122–132, and 398–401(Rosen). Surfactants are generally characterized as having a hydrophilic head group and a hydrophobic tail group. Examples of the tail groups include straight chain, long alkyl groups (carbon chain length varies from $C_8$ to $C_{20}$), branched chain, long chain ($C_8$–$C_{15}$) alklybenzene residues, long chain perfluoroalkyl groups, polysiloxane groups, hand high molecular weight propylene oxide polymers.

Examples of anionic surfactants include carboxylic acid salts, amine salts, acylated polypetides, sulfonic salts, higher alkylbenzene sulfonates, sodium dodecyl sulfate (SDS), sodium alkene sulfonate (SAS), olefin sulfonates (AOS), sulfosuccinate esters, sulfated linear primary alcohols, sulfuric acid ester salts, phosphoric amides, polyphosporic acid esters and perfluorinated anionics. Preferred anionic surfactants include SDS, SAS, Hamposyl family of surfactants (manufactured by Dow Chemical Company) and their alkali free derivatives., Examples of cationic surfactants include long chain amines and their salts, diamines and polyamines and their salts, quaternary ammonium salts, polyoxyethylenated (POE) long chain amines, quaterized polyoxyethylenated long chain amines, amine oxides and cetyl trimethyl ammonium bromide (CTAB) or cetyl trimethyl ammonium chloride (CTAC). Preferred cationic surfactants include dodecyl trimethylammonium bromide ($C_{12}$TAB) and related compounds with varying hydrophobic chain length. Other preferred examples of cationic surfactants include dodecylammonium chloride and cetylpyridium bromide. In each of these cases the hydrophobic chain length can be varied from $C_8$ to $C_{20}$.

Examples of zwitterionics include B-N alkylaminopropionic acids, N alkyl-B iminodipropionic acids, imidazoline carboxylates, N-alkylbetanies, amine oxides, sulfobetanies and DAPRAL® variants, such as KETJENLUBE 522®. KETJENLUBE 522® is the current tradename for what had been called DAPRAL GE 202®, now produced by the Akzo Nobel Functional Chemicals, Netherlands. This material is a water soluble copolymer of an average molecular weight of approximately 15,000 consisting of a-olefins and dicarboxylic acids, partially esterified with an ethoxilated alcohol. KENJENLUBE 522® is highly lubricating and dispersing.

Examples of non-ionic surfactants include polyoxyethlyenated alkylphenols, alkylphenol, polyoxyethlyenated straight chain alcohols, polyoxyethlyenated polyoxypropylene glycols, polyoxyethlyenated mercapatans, long chain carboxylic acid esters polyoxyethlyenated silicones, tertiary acetylenic glycols and TRITON X-100® manufactured by the Dow Chemical Corporation, MI (formerly the Union Carbide Corporation. TRITON X-100® is octylphenol ethylene oxide condensate and is also referred to as OCTOXYNOL-9®. This material has a molecular weight of 625 amu.

Preferred examples of non-ionic surfactants include TWEEN-80™ and the family of TRITON X® compounds, TWEEN-80™ is manufactured by the ICI group of companies, New Castle, Del. TWEEN 80® is polyoxyethylene sorbitan monooleate, and has the following synonyms: TWEEN 80®1, polyoxyethylene sorbitol ester, polysorbate 80 and PEG (20) sorbitan monooleate. This material has the molecular formula $C_{64}H_{124}O_{263}$ and a corresponding molecular weight of 13103 amu.

In each of these surfactants the head group and the tail group can be varied to provide similar effects in the slurry but at different concentration levels. In certain cases it may be advantageous to use mixed surfactants to control the adsorption density, the strength of the surfactant adsorption. Examples of some possible synergistic effects are given in pg. 398–401 of Rosen. Additionally some salts as outlined earlier may be added which control the strength of the surfactant adsorption.

The concentration of the surfactants used depends on the type of the surfactant used, the surfaces of materials in which the slurry solution is contact with, and its bulk critical micelle concentration (CMC) value. At low concentration, the surfactant may adsorb onto the solid surfaces in a patchy manner and change the electrostatic properties and the surface energy of the surface. The adsorption of the surfactant may reduce the etch rate of the surface layer.

At higher surfactant concentrations, the surfactant molecules may coalesce together to form self assembled structures. The bulk CMC value of the surfactant is defined as the minimum concentration at which the surfactants self assemble to form structured layers in a bulk solution. Examples of structured surfactants can include spheres, cylindrical rods, bi-layers, disks and vesicles. Once the bulk CMC is reached, the surface tension of the solution does not decrease further, but is accompanied by a rapid drop in the electrical conductivity of the bulk solution. The formation of micelles is thought to be due to the reduction in the free energy of the solution.

For the surfactants to be effective during the polishing process, they should be readily adsorbed at the interfaces of the materials which are being polished such as copper, silver and tantalum, but also to the solid particles which are present in the slurry. As in the bulk, the surfactant in the slurry can reassemble and form structured layers on the surface of the solid interfaces. In this case, the concentration at which the structured layers form is not a fixed value, but varies with the type of the materials which the solution is in contact with. Typical concentrations at which this self assembly takes place varies from 10% of bulk CMC to 500% of bulk CMC. Concentrations of 1% to 100 times the bulk CMC value have been used. If the CMC values are not available, the concentrations of the surfactant can typically vary from 0.01 weight percent to 30 weight percent.

The surfactant additives described above can be supplanted or used in combination with polymeric additives such as polyethylene oxide (PEO), polyacrylic acid (PAA), polyacryamide (PAM), polyvinylalcohol (PVA), polyalkylamine (PAH) and related compounds. These polymer additives can be used as dispersants for particles in the slurry. The molecular weight of these additives can vary from 500 to 100,000 amu. The concentration of the additives can vary from 0.1 mg/liter to 10.0 g/liter.

The reaction rate at the surface can be also controlled by the addition of chelating agents or complexing agents which can bind with the metal comprising ions in the solutions and the metal comprising on the surface. Examples of the chelating agents which have been used to modify the reaction rate kinetics include EDTA, and bidentate ligands such as ethylenediammine (en), acteylacetonate ion (acac), phenanthroline (phen), citric acid, acetic acid and oxalates and related compounds. The concentration of these chemicals can be varied from 0.1 mM to 100 mM in the solution. Applied to copper polishing, the copper removal rate was found to generally increase with the addition of chelating agents.

For the chemical mechanical polishing process, various types of pads can be used. Typically the pads are polymeric in nature. An example of a commercial pad is IC 1000 supplied by Rodel Co in Delaware. To achieve a higher quality of surface finish these pads can be modified either by coating a thin film of a inorganic materials such as diamond like carbon (DLC), amorphous carbon, silicon dioxide, various other metallic oxides, nitrides such as TiN or TaN and their mixtures. The pad can also be embedded with particles such as silica, alumina, and ceria, as described earlier. Thus, enhanced CMP can be conducted using suitable modified pads.

The layer formed by the slurry is preferably thin, continuous and substantially non-porous to the slurry. Typically, the thickness of the layer formed during CMP should be from 2 nm to approximately 1 µm. This thickness refers to the dynamic thickness of the layer during CMP processing given the concurrent growth and removal processes. If polishing is stopped, the resulting layer thickness can be expected to increase. If the layer formed on the surface is too thick, generally being greater than about 1 µm, surface planarity will generally not be achieved. This is because both the high and low topographies present on the wafer surface will receive nearly the same polishing rate.

If the layer is substantially porous, reactants in the slurry solution can diffuse through the soft layer and react with the metal comprising film. This can result in the thickness of the soft layer increasing during the time required to complete the polishing process. To ensure that the surface soft layer is non-porous and does not exceed approximately 1 µm in thickness, additives, sometimes referred to as inhibitors, can be added to passivate the soft layer. Passivating agents reduce the rate of the surface reaction by covering porous regions and the subsurface layer regions. For example, additives such as benzotriazole (BTA), imidazole, and other nitrogen containing compounds such as tolytriazole (TTA), mercaptans, oxalic acid, sodium hexanoate, carboxylic acid thiols and other derivatives of hydroxy, and amino, imino, carboxy, mercapto, and aklyl substituted groups can be used to passivate the soft layer. Other examples include benzoates, dodecaionic acid, other carboxylic acids and surfactants mentioned earlier. Preferred additives for passivation include BTA and TTA, mercaptons and thiol based compounds. Some of these additives may be recognized as also being listed as preferred surfactants herein. A typical concentration of additives ranges from 0.0001 mM to 500 mM. Preferably, the additive concentration in the slurry is less than 100 mM.

Certain etchants can be added to the slurry to remove thin metal comprising oxide layers or carbon based impurities from the metal comprising film. Chemicals that can slowly etch oxide layers may be added to the CMP slurry. Examples of these etchants include nitric acid, acetic acid, sulfuric acid, hydroxy acid, carboxylic acid, citric acid, malic acid, malonic acid, succinic acid, phtalic acid, EDTA, tartaric acid, dihydroxysuccinic acid, lactic acid, malic acid, fumaric acid, adipic acid, glutaric acid, oxalic acid, benzoic acid, propionic acid butyric acid, valeric acid and their salts. The preferred etchants include citric, succinic, tartaric and acetic acid. Addition of these acids helps ensure that the metal comprising oxide or carbon based impurities are eliminated during the polishing step so that the predominant species becomes the soft surface layer.

The acid concentration to remove the surface oxide layer or carbon based impurities is from approximately 0.0001 M to 1.0 M. The preferred acid concentration is from approximately 0.001 M to 0.05 M.

Acid etchants may be combined in the slurry with passivating additives and/or surfactants. Both the static removal rate of metal comprising and metal comprising polishing rate generally increases with the addition of the acidic etching chemicals to the slurry. In general, the surface layer formed using the invention is primarily insoluble in the slurry solution and is removed mechanically by the pad. However, if etching chemicals are added, the surface layer may be partially removed in a soluble form. Preferably, the metal comprising film removed is substantially insoluble and is substantially (>90%) removed as a solid by the mechanical process that is provided by the mechanical rubbing of the pad on the surface of the wafer. Thus, the maximum etching rate based on the removal rate should preferably not exceed 10% of total removal rate.

Etchants can also be used in a preconditioning step to clean the surface of materials such as native oxide prior to initiating polishing. When the slurry contains a low density of particles or no particles at all, the role of preconditioning the metal layer can become increasingly important. A "native" oxide layer is typically formed on the metal comprising surface prior to CMP processing, which can result in wide variability in the polishing results. The thickness of the native oxide layer depends on the conditions to which the metal wafer has been subjected. As the metal comprising oxide layer is hard, it becomes difficult to remove this layer without the application of a hard particle surface. One way to initiate the metal comprising polishing step is to clean the surface of the metal comprising with an etching chemical before initiating the metal comprising polishing step. Reagents such as EDTA, citric acid, maleic acid, acetic acid, HCl, HBr, nitric acid, and ammonium based solutions can be used for this purpose.

Salts can be added to the slurry to control the concentration of chemical reactants in the slurry solution. For example, salts such as iodides, bromides, chlorides and carbonates can be added to an iodine slurry solution to help control the CMP removal rate by controlling the reaction rate. Some examples of salts which can be used with halide reactants include KI, KBr, $KCO_3$, $NH_4I$, $KNO_3$, KCl and $NH_4Cl$. KI, $NH_4I$ is a preferred salt for use in the slurry since the reaction of KI with $I_2$ is a preferred method for forming $I_3^-$.

Salts may be used in conjunction with passivating additives, such as TTA, BTA, and/or surfactants. The concentration of salts is generally from 0.001 M to 1 M. The preferred salt concentration is generally between 0.01 M and 0.1 M.

Polishing pressure and the linear polishing rate can be used to optimize CMP results. Polishing pressure is generally from 0.1 psi to 10 psi, with a preferred polishing pressure of 0.2 psi to 5 psi. The linear polish rate, which is the product of the rotation speed and the center of the wafer from center of the platen is generally from 20 ft/min to 1500 ft/min. The linear polishing rate primarily depends on the type of polisher, the size of the wafer, the diameter of the platen wheel and the angular velocity.

A method for chemical mechanical polishing (CMP) a metal comprising containing film includes the steps of providing a slurry including at one halide ion and at least one halogen species. The slurry reacts with the metal film to form a layer on a surface of said film which has a hardness less than the metal comprising film. The slurry solution is applied to the metal comprising film to form a surface layer and the surface layer is then polished off

EXAMPLES

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

Examples 1

A slurry composition containing 7 mM iodine and 20 mM KI was used to polish a copper film in a table top polishing system using a IPEC 372 system. The slurry pH was varied from 1 to 8. In one experiment the slurry had no abrasives, while in another experiment the slurry had 5% 50 nm sized silica particles. The polishing pressure was varied from 0.1 psi to 5 psi. The polishing rates under different conditions is shown below:

| PH  | Abrasives | Pressure (psi) | Removal Rate for copper (nm/min) |
| --- | --------- | -------------- | -------------------------------- |
| 2.0 | No        | 1.0            | 150                              |
| 4.0 | No        | 1.0            | 155                              |
| 7.0 | No        | 1.0            | 132                              |
| 3.0 | No        | 3.0            | 158                              |
| 3.0 | No        | 5.0            | 142                              |
| 3.0 | No        | 0.2            | 85                               |
| 4.5 | Yes       | 1.7            | 192                              |
| 4.5 | Yes       | 3.0            | 210                              |
| 4.5 | Yes       | 0.3            | 132                              |

Example 2

In this example the concentration of the halogen and the halide species were varied. The pH of the slurry was maintained at 4.0, while the polishing pressure was set at 2.2 psi. No particles were used in the slurry.

| Iodine Concentration (mN) | Halide ion Concentration (mM) | Cu Removal rate (nm/min) |
| ------------------------- | ----------------------------- | ------------------------ |
| 0.5                       | 10 KI                         | <5                       |
| 2                         | 10 KI                         | 20                       |
| 6                         | 20 KI                         | 95                       |
| 25                        | 150 KI                        | 520                      |
| 4                         | 10 KI + 5 KBr                 | 50                       |
| 6                         | 10 KI + 5 $NH_4I$             | 102                      |

Example 3

In this example the types and the concentration of the particles was varied. The chemicals in the slurry were 7 mM Iodine and 50 mM KI. The pH was maintained at 4.0. The samples were polished using a IPEC 372 system.

| Size and Type of Particle      | Concentration | Cu Removal Rate (nm/min) |
| ------------------------------ | ------------- | ------------------------ |
| 50 nm Silica                   | 5%            | 146                      |
| 46 nm Silica                   | 0.1%          | 98                       |
| 60 nm Silica                   | 2%            | 135                      |
| 50 nm Silica                   | 15%           | 165                      |
| 20 nm Silica                   | 2%            | 138                      |
| 400 nm Silica                  | 2.4%          | 165                      |
| 150 nm porous Silica           | 2%            | 146                      |
| 55 nm alumina                  | 2%            | 138                      |
| 40 nm titania                  | 1.7%          | 96                       |
| 50 nm silica (coated with alumina) | 2.7%      | 165                      |

Example 4

In this example the effect of other additives, such as corrosion inhibitors and surfactants, complexing agents, were shown on the removal rate of copper. The slurry contained 9 mN iodine and 40 mM KI solution. It also contained 2% silica particles. The polishing experiments were conducted using a IPEC 372 System. The polishing pressure was 2 psi while the platen speed was 65 rpm.

| Additive and Concentration        | Copper Removal Rate (mn/min) |
| --------------------------------- | ---------------------------- |
| 10 mM BTA                         | 86                           |
| 5 mM TTA                          | 78                           |
| 10 mM Acetic Acid                 | 176                          |
| 0.1% SDS (sodium docecyl sulfonate) | 165                        |
| 20 mM KBr                         | 146                          |

Example 5

This example shows the polishing of other substrates. The concentration of iodine ($I_2$) was 25 mN, iodine ions was 85 mM, and citric acid was 0.1 M. The pH was 4.0 and the concentration of 110 nm silica particles was 5% in the slurry. The polishing pressure used was 4.0 psi. It should be noted that the particle instead of being in the slurry can be embedded into the pad.

| Substrate | Removal Rate (nm/Min) |
| --------- | --------------------- |
| Ta        | 96                    |
| TaN       | 84                    |
| W         | 194                   |
| TiN       | 87                    |
| Ag        | 106                   |

Example 6

This example shows the effect of using different types of pads in the polishing process. The slurry contained 11 mN iodine and 100 mM KI. The polishing pressure was 2.4 psi and the platen speed was 65 rpm. The pH of the solution was 4.0. The IC 1000 pad was obtained from Rodel Company.

| Pads Used                             | Removal rate of Copper (nm/min) |
| ------------------------------------- | ------------------------------- |
| IC 1000                               | 265                             |
| IC 1000 coated with Silica            | 227                             |
| IC 1000 coated with DLC               | 244                             |
| Polymeric Pad embedded with silica particles | 256                      |

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

I claim:

1. A slurry for chemical mechanical polishing (CMP) of a metal comprising film, comprising a solution including:
    at least one halide ion,
    at least one diatomic halogen molecule selected from the group consisting of $I_2$ $Br_2$, $Cl_2$ and $F_2$ or interhalogen compounds which comprise diatomic molecules which combine different halogen atoms, and particles comprising silica, alumina, titania, yttria, zirconia, zinc oxide, porous silica, or alumina cores or silica cores coated with alumina, yttria, titania, or a polymer.

2. The slurry of claim 1, wherein said diatomic halogen molecule comprises $I_2$.

3. The slurry of claim 1, wherein said halide ion comprises $I^-$.

4. The slurry of claim 1, wherein said diatomic halogen molecule is formed from at least one chemical which forms said halogen in-situ in said the slurry.

5. The slurry of claim 4, wherein said diatomic halogen molecule is $I_2$.

6. The slurry of claim 1, wherein said diatomic halogen molecule comprises $Br_2$ or $Cl_2$.

7. The slurry of claim 1, further comprising at least one surfactant.

8. The slurry of claim 1, further comprising at least one polymer additive.

9. The slurry of claim 1, further comprising at least one salt.

* * * * *